United States Patent [19]

Kato et al.

[11] Patent Number: 5,609,689
[45] Date of Patent: Mar. 11, 1997

[54] VACUUM PROCESS APPARAUS

[75] Inventors: Susumu Kato, Isawa-Cho; Hirofumi Yamaguchi, Sudama-Cho, both of Japan

[73] Assignee: Tokyo Electron Limited, Tokyo-to, Japan

[21] Appl. No.: 660,215

[22] Filed: Jun. 3, 1996

[30] Foreign Application Priority Data

Jun. 9, 1995 [JP] Japan ..................................... 7-168142

[51] Int. Cl.$^6$ .............................. C23C 16/00; H01L 21/00
[52] U.S. Cl. ........................ 118/719; 118/724; 118/725; 118/729; 156/345; 414/217; 414/939
[58] Field of Search ..................... 118/719, 724, 118/725, 729; 156/345; 414/939, 217

[56] References Cited

U.S. PATENT DOCUMENTS 5,512,320 4/1996 Turner ..................................... 118/719
5,516,732 5/1996 Flegal ..................................... 414/939

FOREIGN PATENT DOCUMENTS 60-115226 6/1985 Japan .
5-160030 6/1993 Japan .
5-182930 7/1993 Japan .

*Primary Examiner*—Richard Bueker
*Attorney, Agent, or Firm*—Beveridge, DeGrandi, Weilacher & Young L.L.P.

[57] ABSTRACT

A cooling table for cooling a processed object of process in a vacuum reserve chamber is provided with support members, which support the object with predetermined gaps between the object and the table, so that the processed object can be cooled without directly touching the cooling table. Accordingly, no chemical reactions attributable to the plane contact between the object of process and the cooling table can be caused, so that the object cannot be contaminated. Even if the object is somewhat warped and subjected to fine vibrations by rapid cooling, moreover, it never rubs against the cooling table, so that no particles can be produced. Further, a preheating device for preheating the unprocessed object is provided overlying the cooling table. Thus, the vacuum reserve chamber can be used for preheating the unprocessed object as well as for cooling the processed object, so that the throughput can be improved.

7 Claims, 5 Drawing Sheets

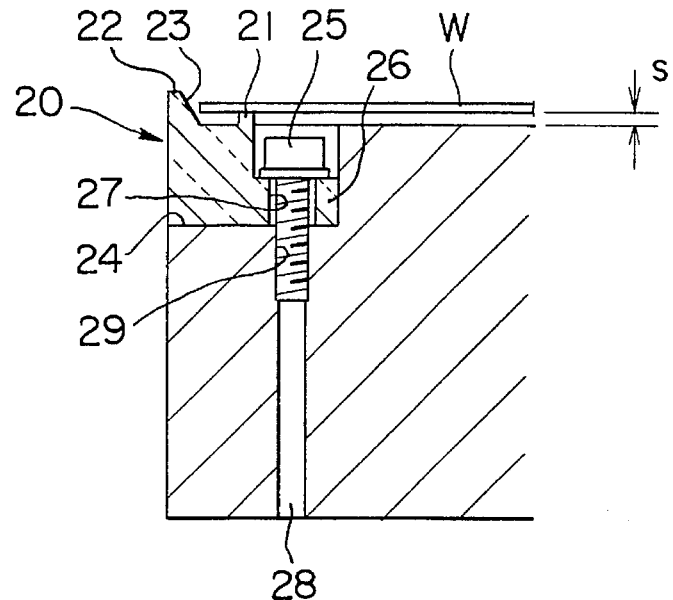
F I G. 2
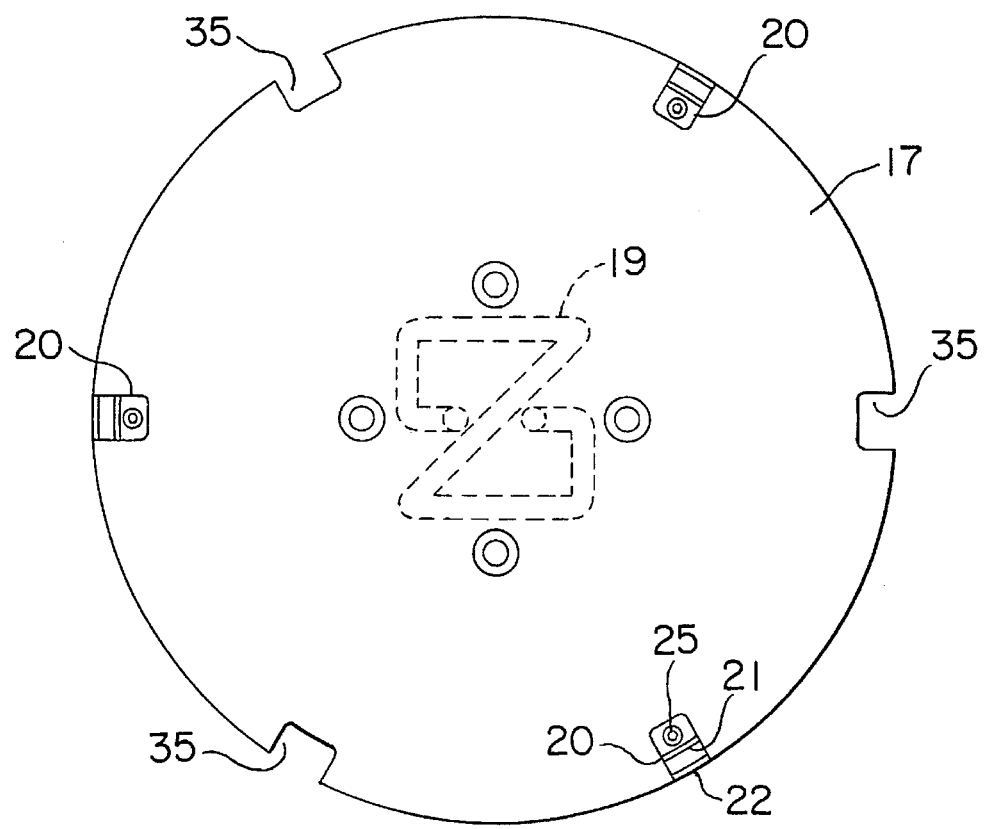
F I G. 3

VACUUM PROCESS APPARAUS

BACKGROUND OF THE INVENTION

1. Field of the Invention

The present invention relates to a vacuum process apparatus, in which contamination of objects of process and production of particles can be prevented to improve the yield even in the case where the objects are cooled in a vacuum reserve chamber, and the vacuum reserve chamber can be used to preheat unprocessed objects and cool processed objects.

2. Information of the Related Art

In manufacturing processes for semiconductor devices, semiconductor wafers, as objects of process, are subjected to various processes, such as film formation, oxidation, doping, annealing, etching, etc. Some vacuum process apparatuses (Jpn. Pat. Appln. KOKAI Publication Nos. 3-19252, 4-133422, etc.) have been proposed in order to improve the throughput of the process processes, prevent production of particles, and save spaces.

In these vacuum process apparatuses, a vacuum reserve chamber, whose internal pressure can be restored to the level of the atmospheric pressure, is connected to vacuum process chambers in which wafers are subjected to predetermined processes. The wafers can be carried into or out of the vacuum process chambers through the vacuum reserve chamber.

In some vacuum process apparatuses, the vacuum reserve chamber is provided with a cooling table for cooling a processed high-temperature wafer. According to such vacuum process apparatuses, the processed wafer is set on the cooling table, and the vacuum reserve chamber is supplied with an inert gas so that its internal pressure is restored to the atmospheric pressure level as the wafer is cooled. Thus, the processed high-temperature wafer can be quickly brought to a chemically stable state such that it cannot easily react with the atmosphere, and therefore, the throughput can be improved.

When the wafers are cooled in the vacuum process apparatuses of this type, however, it is set on the cooling table in the vacuum reserve chamber in a manner such that its whole surface is in plane contact with the table. If the cooling table is formed of a metal, therefore, a metallic film or the like on the wafers and the metal of the table undergo a chemical reaction, so that the wafers may possibly be contaminated.

If the wafers are cooled rapidly, they may be somewhat warped and subjected to fine vibrations, in some cases. The fine vibrations cause the wafers to rub against the cooling table, so that particles are produced. These particles adhere to the wafers, possibly resulting in defectives and lowered yield.

In order to improve the throughput, moreover, there is a demand that the vacuum reserve chamber be used to preheat unprocessed objects of process and cool processed objects.

SUMMARY OF THE INVENTION

The object of the present invention is to provide a vacuum process apparatus, in which contamination of objects of process and production of particles can be prevented to improve the yield even in the case where the objects are cooled in a vacuum reserve chamber, and the vacuum reserve chamber can be used to preheat unprocessed objects and cool processed objects.

In order to achieve the above object, a first vacuum process apparatus according to the present invention is provided with a plurality of vacuum process chambers for subjecting an object of process to predetermined processes, and comprises: a vacuum reserve chamber for delivering the object in a substantially vacuum state to the vacuum process chambers and receiving the processed object substantially at the atmospheric pressure from the vacuum process chambers; a cooling table for cooling the processed object in the vacuum reserve chamber; and support members arranged so as to support the object over the cooling table with predetermined gaps between the object and the table.

Thus, the cooling table for cooling the processed object of process in the vacuum reserve chamber is provided with the support members, which support the object with the predetermined gaps between the object and the table, so that the processed object can be cooled without directly touching the cooling table. Accordingly, no chemical reactions attributable to the plane contact between the object of process and the cooling table can be caused, so that the object cannot be contaminated. Even if the object is somewhat warped and subjected to fine vibrations by rapid cooling, moreover, it never rubs against the cooling table, so that no particles can be produced.

A second vacuum process apparatus according to the invention is provided with a plurality of vacuum process chambers for subjecting an object of process to predetermined processes, and comprises: a vacuum reserve chamber for delivering the object in a substantially vacuum state to the vacuum process chambers and receiving the processed object substantially at the atmospheric pressure from the vacuum process chambers; a cooling table for cooling the processed object in the vacuum reserve chamber; and preheating means arranged over the cooling table so as to preheat the unprocessed object.

With this arrangement, the vacuum reserve chamber can be used for preheating the unprocessed object as well as for cooling the processed object, so that the throughput can be improved.

BRIEF DESCRIPTION OF THE DRAWINGS

FIG. 2 is an enlarged sectional view showing the principal part of a cooling table in the vacuum reserve chamber of FIG. 1;

FIG. 3 is a plan view of the cooling table in the vacuum reserve chamber of FIG. 1;

DETAILED DESCRIPTION OF THE PREFERRED EMBODIMENTS

A multi-chamber vacuum process apparatus having a plurality of vacuum reserve chambers according to one embodiment of the present invention will now be described in detail with reference to the accompanying drawings.

Figure 5:
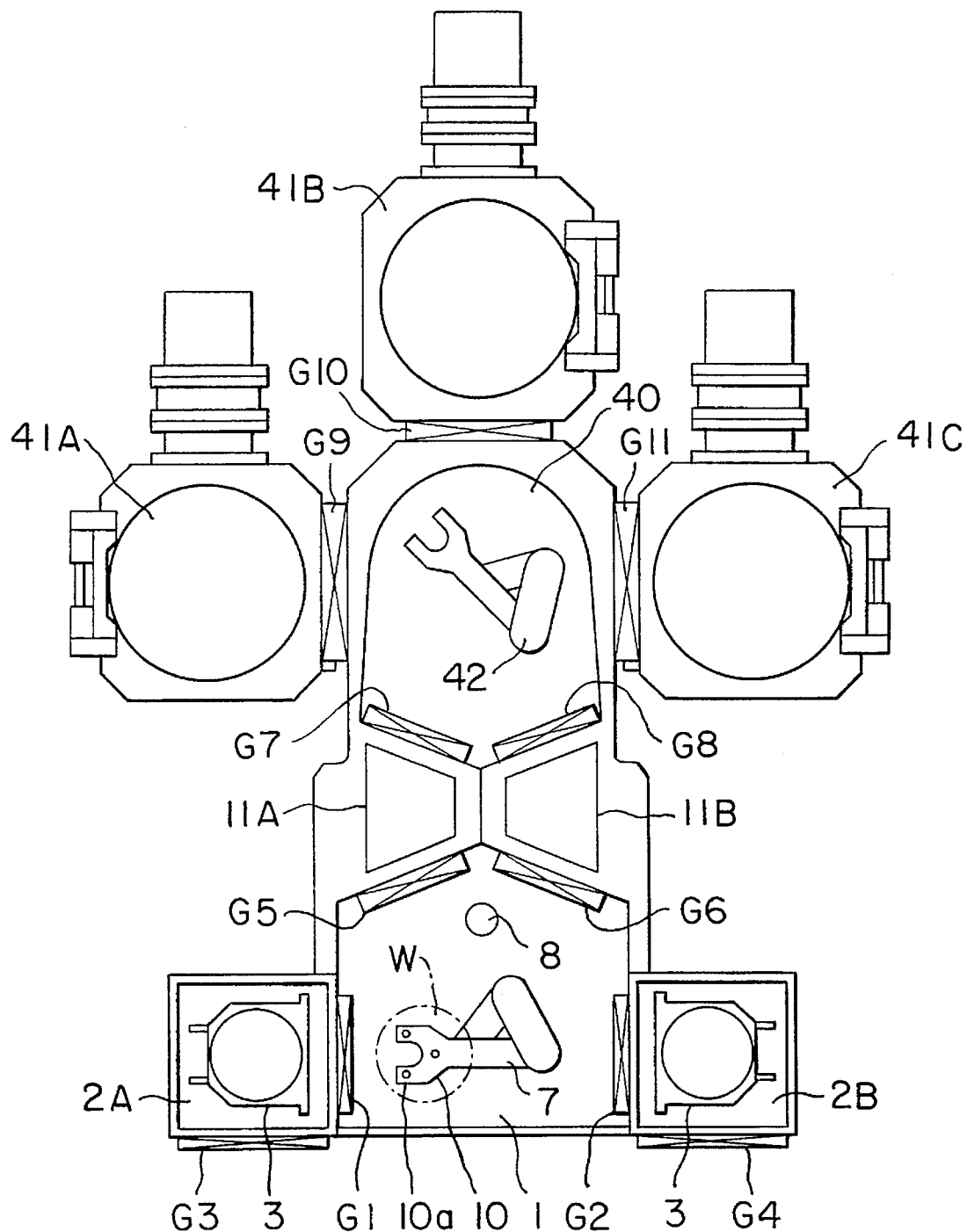
FIG. 5 is a plan view schematically showing an outline of the vacuum process apparatus.
Figure 6:
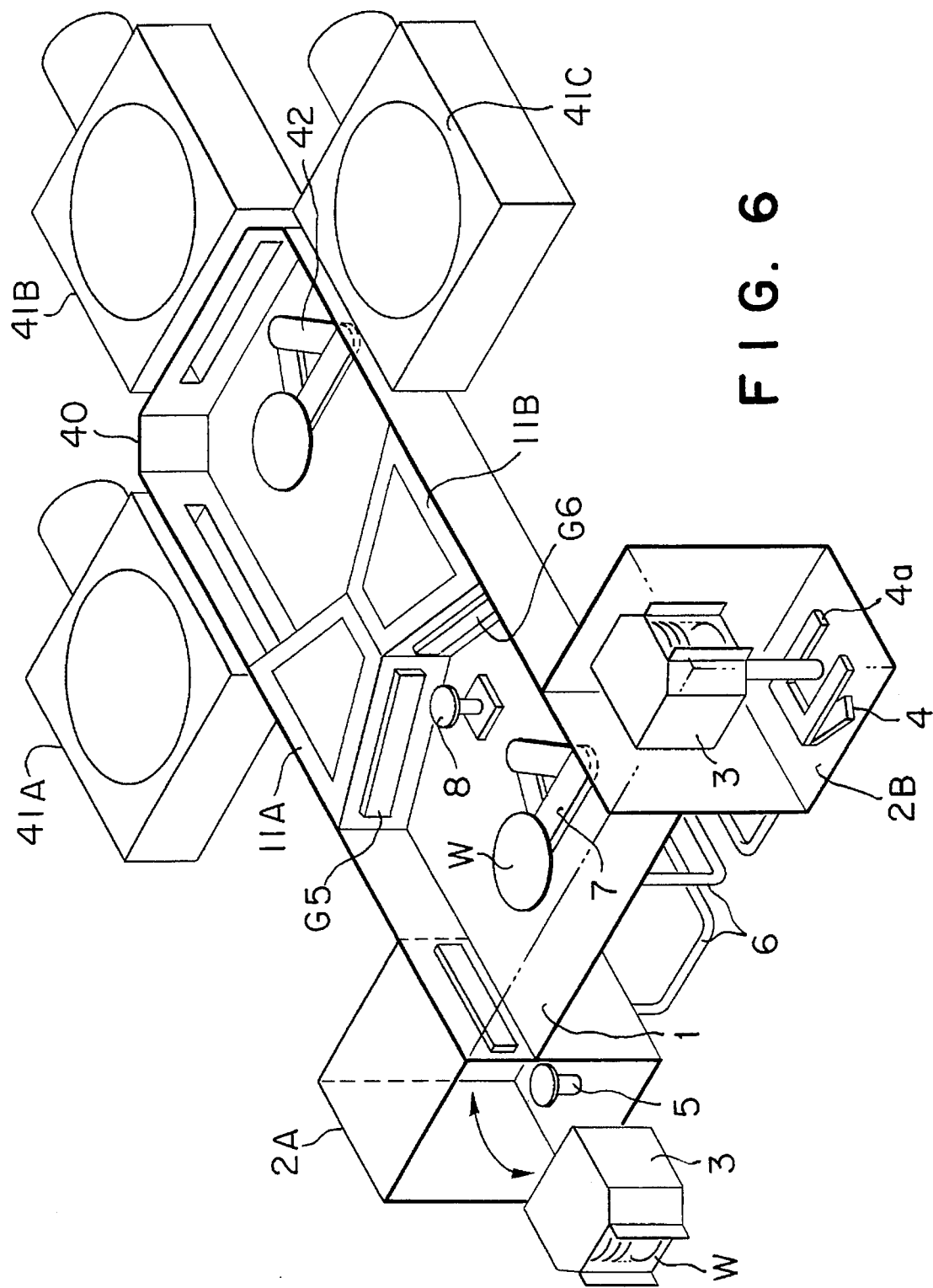
FIG. 6 is a perspective view of the vacuum process apparatus shown in FIG. 5.

In FIGS. 5 and 6 showing an outline of the vacuum process apparatus, numeral 1 denotes a first transfer chamber, which constitutes a loader chamber. First and second cassette chambers 2A and 2B are connected to the opposite sides of the transfer chamber 1 through first and second gate valves G1 and G2, respectively. Each cassette chamber contains a cassette 3, which is stored with a plurality of (e.g., 25) objects of process, such as semiconductor wafers W, arranged at predetermined intervals (e.g., 5-mm intervals).

The cassette chambers 2A and 2B are provided with gate valves G3 and G4, respectively, for external access. A cassette delivery mechanism 4 and a liftable cassette stage 5 are arranged in each cassette chamber. The delivery mechanism 4 includes a U-shaped arm 4a, which can support the cassette 3 with the wafers W kept horizontal, and is used to carry the cassette 3 into or out of the cassette chamber through the gate valve G3 or G4. The cassette stage 5 can receive the cassette 3 from the arm 4a and support it so that its height is adjustable. The first transfer chamber 1 and the cassette chambers 2A and 2B are connected individually with gas supply pipes 6, through which an inert gas, e.g., nitrogen gas, is fed into the chambers. Thus, these chambers are charged with an inert gas ambience, which is kept at the atmospheric pressure (normal pressure) or a higher pressure by means of a pressure regulator (not shown).

Arranged in the first transfer chamber 1 is a first transfer mechanism 7 and a rotating stage 8 for aligning the center and orientation flat of each wafer W. The rotating stage 8, along with the first transfer mechanism 7 and an optical sensor (not shown) for detecting the position of the peripheral edge of each wafer W, constitutes a wafer aligning mechanism. If the center of a wafer W is found to be deviated from that of the rotating stage 8, for example, the wafer position is modified by the first transfer mechanism 7. The first transfer mechanism 7 includes a contractible multi-joint arm 9, rotatable in the horizontal direction, and a pick 10 at the distal end of the arm 9. The pick 10 has suction holes 10a through which the wafer W is supported by suction. The wafer W is transferred between the cassette 3 in the first or second cassette chamber 2A or 2B, the rotating stage 8, and first and second vacuum reserve chambers 11A and 11B.

Figure 1:
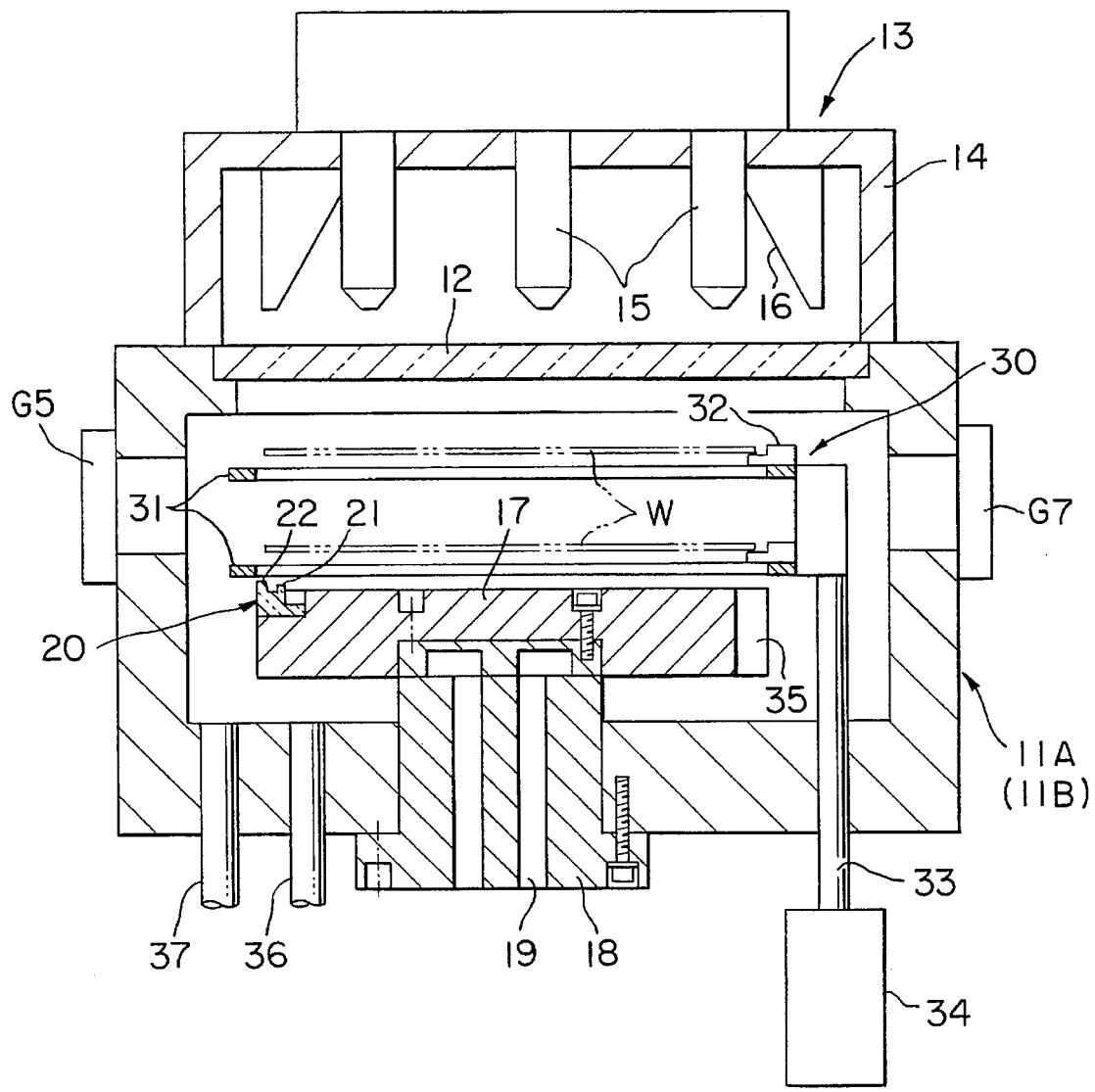
FIG. 1 is a sectional view of a vacuum reserve chamber of a vacuum process apparatus according to one embodiment of the present invention.

The first and second vacuum reserve chambers 11A and 11B are connected to the rear side of the first transfer chamber 1 through gate valves G5 and G6, respectively. As shown in FIG. 1, each vacuum reserve chamber has a window 12, which is fitted with quartz glass on the top. Provided on the window 12 is a heating device (heating means) 13 for heating (preheating) an unprocessed wafer W to a predetermined temperature, e.g., 400° to 500° C., in a decompressed ambience. The heating device 13 includes a lamp case 14 and a plurality of heating lamps 15, formed of e.g. halogen lamps, therein. A reflector 16 is provided surrounding the heating lamps 15, whereby the wafer W can be heated quickly and uniformly.

A cooling table 17 is located in the lower part of each of the vacuum reserve chambers 11A and 11B. The table 17 is used to cool the processed wafer W to a predetermined temperature, e.g., 70° C. or less, preferably 50° to 60° C., such that the wafer W is chemically stable and the cassette 3 cannot be thermally affected, as the internal pressure of the reserve chamber is restored to the atmospheric pressure by the inert gas. The cooling table 17 is a disk of a metal, such as an aluminum alloy, having a diameter substantially equal to or a little greater than that of each wafer W. The table 17 has a leg 19 attached to the central portion of its lower surface, whereby it is kept off the base of the vacuum reserve chamber. The leg 18 is formed with a cooling water passage 19 through which cooling water, e.g., pure water, of a predetermined temperature, e.g., 15° C., is circulated to cool the cooling table 17. A cooling water circulation system (not shown) is connected to the passage 19.

As is also shown in FIGS. 2 and 3, three support members 20 are arranged at suitable or regular intervals along the peripheral edge of the cooling table 17, whereby the wafer W can be supported above the upper surface of the table 17 with predetermined gaps of, e.g., 0.5 to 1 mm.

More specifically, the peripheral edge of the lower surface of the wafer W can be supported by means of arcuate support portions 21, which are formed individually on the respective top portions of the support members 20. Thus, the processed wafer W can be cooled without directly touching the cooling table 17, so that no chemical reactions attributable to the plane contact between the wafer W and the table 17 can be caused, and therefore, the wafer W cannot be contaminated. Even if the wafer W is somewhat warped and subjected to fine vibrations by rapid cooling, moreover, it never rubs against the cooling table 17, so that no particles can be produced.

Further, an arcuate regulating portion 22 for restraining horizontal movement of the peripheral edge of the wafer W protrudes upward from the top portion of each support member 20. Since the regulating portions 22 are arranged at suitable intervals along the peripheral edge of the cooling table 17, the wafer W can be supported easily and accurately over the cooling table 17 with predetermined gaps between the wafer W and the table 17.

The support members 20 are formed of a material, such as quartz, which is resistant to heat and never forms a contaminant to the wafers W. In the case where the objects of process permit some contamination, however, the support members 20 may be formed of aluminum or some other metal.

The support portions 21 and the regulating portions 22 need not always be arcuate, and may be straight in shape. If the regulating portions 22 have an arcuate shape that matches the diameter of the wafers W, a plurality of types of support members 20 must be fabricated to cope with the differences in size (diameter) between the wafers W. If the regulating portions 22 are straight in shape, however, only one type of support members 20 must only be manufactured, so that the manufacturing cost can be reduced. Although the regulating portions 22 may only be set up vertically, they should preferably have inside tapers 23 for positioning each wafer W.

Fitting grooves 24 for mounting the support members 20 are arranged on the peripheral edge of the cooling table 17, and each support member 20 is removably attached to each corresponding groove 24 by means of a bolt 25, as shown in FIG. 2. In this case, each support member 20 is formed with a flange portion 26, which is recessed lest the head of the bolt 25 project above the upper surface of the cooling table 17. The flange portion 26 is provided with a bolt hole 27 through which the bolt 25 is passed. Each fitting groove 24 is provided with a hole 28, which vertically penetrates the table 17, corresponding to the bolt hole 27. A female screw 29, which mates with the bolt 25, is formed at the upper part of the hole 28. A hexagon-socket-head bolt is used as the bolt 25.

Figure 4:
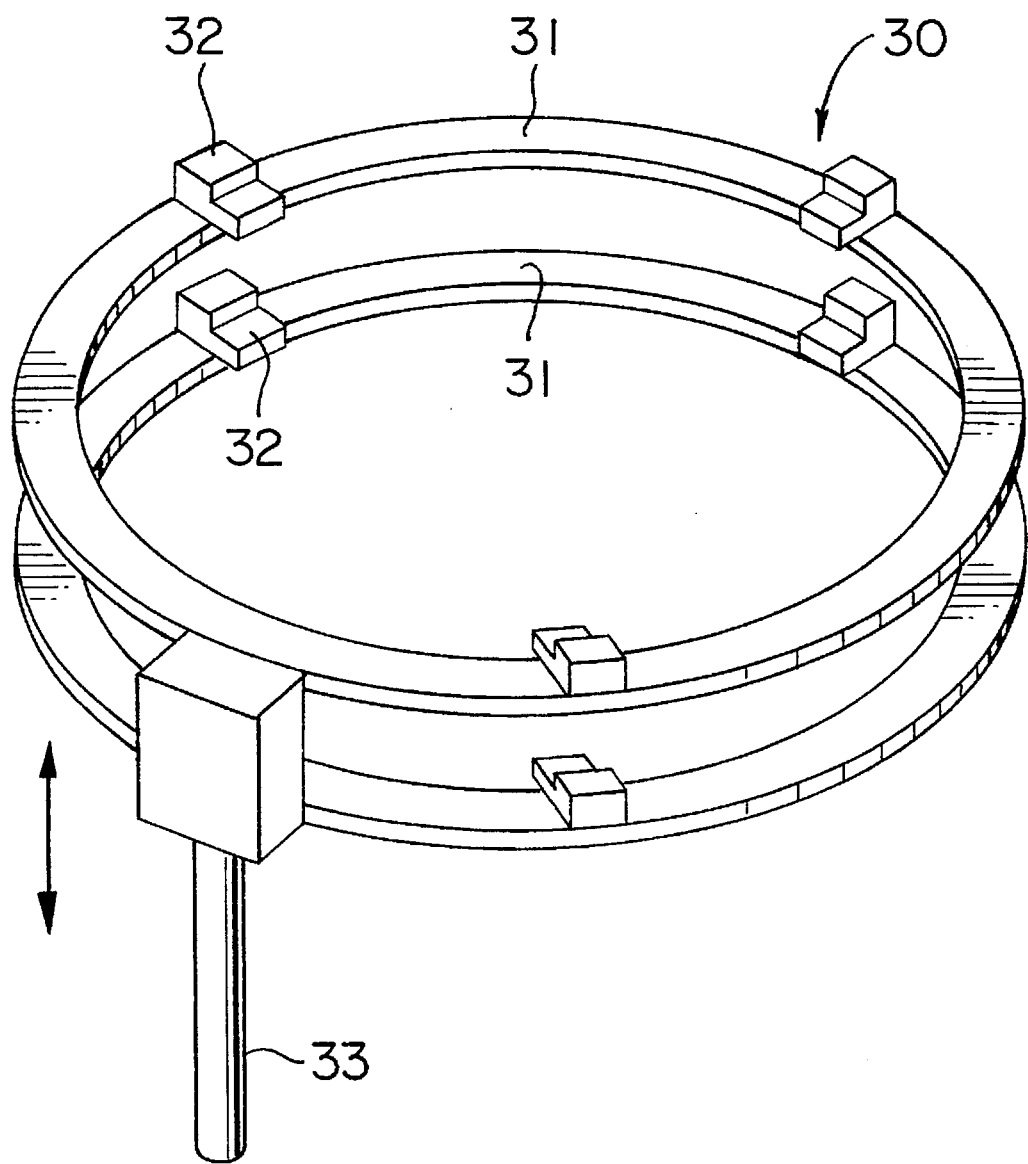
FIG. 4 is a perspective view showing a wafer support liftable in the vacuum reserve chamber.

Arranged in each vacuum reserve chamber is a two-stage liftable wafer support 30, which is designed so as to support an unprocessed wafer W on its upper stage and a processed wafer W on its lower stage. As is also shown in FIG. 4, the wafer support 30 includes two rings 31, upper and lower, which are a little larger in diameter than the cooling table 17. Three retaining claws 32 of, quartz for holding the peripheral edge of the wafer W are arranged at regular intervals in the circumferential direction on the top of each ring 31. The two rings 31 are removably mounted on a lift shaft 33.

The lift shaft 33 penetrates the base of the vacuum reserve chamber 11A (11B) for airtight sliding motion, and is coupled to a lift mechanism 34. The wafer support 30 is designed so as to be liftable by means of the lift mechanism 34 in order to deliver the wafers W between the arm 9 of the first transfer mechanism 7 (or second transfer mechanism mentioned later) for horizontal movement and the upper or lower stage of the wafer support 30. The retaining claws 32 are arranged in positions deviated from the support members 20 on the cooling table 17 in the circumferential direction lest they interfere with the support members 20. Grooves 35 are formed in the outer peripheral surface of the cooling table 17, whereby their corresponding retaining claws 32 of the lower ring 31 are allowed to move as the wafer support 30 descends. In the vacuum reserve chamber 11A (11B), the unprocessed wafer W on the upper stage of the wafer support 30 is heated (preheated) in an upper limit position by means of the heating lamps 15, while the wafer W on the lower stage is delivered to the support members 20 on the cooling table 17 to be cooled as the lower ring 31 descends along the outer periphery of the table 17.

The vacuum reserve chamber 11A (11B) is connected with an exhaust pipe 36, which connects with a vacuum pump (not shown) for reducing the pressure in the chamber to a predetermined pressure level of $10^{-3}$ to $10^{-6}$ Torr. Also, the reserve chamber is connected with a gas supply pipe 37, which connects with a source of an inert gas, nitrogen gas, for restoring the pressure in the chamber to normal pressure. A second transfer mechanism 40 is connected to the rear side of the first and second vacuum reserve chambers 11A and 11B through gate valves G7 and G8, respectively. Arranged in the transfer chamber 40 is a second transfer mechanism 42, which, formed of a multi-joint arm, for example, is used to transfer wafers W between the vacuum reserve chambers 11A and 11B and first, second, and third vacuum process chambers 41A, 41B and 41C mentioned below.

The first, second, and third vacuum process chambers 41A, 41B and 41C are connected to the left-hand, rear, and right-hand sides of the second transfer chamber 40 through gate valves G9, G10 and G11, respectively. The transfer chamber 40 and the vacuum process chambers 41A to 41C are connected individually with vacuum pumps (not shown) for reducing the pressures in the chambers to a predetermined pressure level of $10^{-7}$ to $10^{-8}$ Torr. The first vacuum process chamber 41A is used to form a titanium film, for example, on a wafer W having a fine pattern thereon by sputtering at a temperature of 400 to 500!n. The second vacuum process chamber 41B is used to form a tungsten layer, for example, on the fine pattern by CVD. Further, the third vacuum process chamber 41C is used to etch the tungsten layer. In this case, the wafer W is subjected successively to the different processes in the first to third vacuum process chambers 41A to 41C. Alternatively, however, these chambers 41A to 41C may be designed for the same process.

The following is a description of the operation of the apparatus according to the present embodiment. First, the gate valves G3 and G4 are opened, and the cassette 3 is carried into the first or second cassette chamber 2A or 2B by means of the cassette delivery mechanism 4, and is delivered to the cassette stage 5 with its open face opposed to the first transfer chamber 1. Subsequently, the gate valves G3 and G4 are closed, the cassette chambers 2A and 2B are charged with the inert gas ambience at the atmospheric pressure, and the cassette 3 is raised to a predetermined position by means of the cassette stage 5.

Then, the gate valves G1 and G2 are opened, one of the wafers W in the cassette 3 is transferred to the pick 10 of the first transfer mechanism 7 by suction, and is carried into the first transfer chamber 1 that is previously charged with the inert gas ambience. Further, the wafer W is released from the suction and delivered to the rotating stage 8, whereupon the orientation flat and center of the wafer W are aligned. The gate valves G5 and G6 are opened, and the wafer W is carried into the first or second vacuum reserve chamber 11A or 11B, which are previously charged with the inert gas ambience at the atmospheric pressure, and is set on the upper stage of the wafer support 30. Thereafter, the cooled processed wafer W on the lower stage is delivered from the first or second vacuum reserve chamber 11A or 11B into the first transfer chamber 1, and returned to the cassette 3.

Subsequently, the gate valves G5 and G6 are closed, the vacuum reserve chambers 11A and 11B are decompressed to a degree of vacuum of, e.g., $10^{-3}$ to $10^{-6}$ Torr, and the heating lamps 15 are lit to preheat the wafer W on the upper stage of the wafer support 30 to 500!n in 30 to 60 seconds, for example. After the preheating is finished, the heating lamps 15 are put out, the gate valves G7 and G8 are opened to allow the second transfer chamber 40, which is previously decompressed to a degree of vacuum of, e.g., $10^{-7}$ to $10^{-8}$ Torr, to communicate with the vacuum reserve chambers 11A and 11B. Then, the wafer W already processed in the vacuum process chambers 41A to 41C is carried into the reserve chamber 11A or 11B by means of the second transfer mechanism 42, and set on the lower stage of the wafer support 30. The preheated wafer W on the upper stage is carried out from the vacuum reserve chamber 11A or 11B and delivered into the vacuum process chambers 41A to 41C to be processed therein.

In carrying out the wafer W on the upper stage of the wafer support 30 by means of the second transfer mechanism 42, the support 30 descends, so that the wafer W on the lower stage is delivered to the support members 20 on the cooling table 17. Then, the gate valves G7 and G8 are closed, and the vacuum reserve chambers 11A and 11B are supplied with the inert gas so that their internal pressures are restored to the atmospheric pressure level as the wafer W is cooled to 50° to 70° C. in 30 to 60 seconds, for example. In this manner, the wafers W in the cassette 3 are processed in succession.

According to the vacuum process apparatus of the present embodiment described above, the unprocessed wafer W is preheated at the predetermined reduced pressure in the vacuum reserve chamber 11A or 11B. Accordingly, water and other impurities on the surface of the wafer W can be removed, and the time required for raising the temperature of the wafer W in the reserve chamber can be shortened, so that the yield and throughput can be improved. In order to cool the processed wafer W in the inert gas ambience, moreover, the processed wafer W can be restored to the cassette 3 in a chemically stable state without reacting with the atmosphere. The throughput can be further improved, since the apparatus is provided with the two vacuum reserve chambers 11A and 11B, the three vacuum process chambers 41A to 41C, and the two-stage wafer support 30 in each reserve chamber.

Since the cooling table 17 for cooling the processed wafer W in the vacuum reserve chamber 11A or 11B is provided with the support portions 21 of the support members 20, which support the wafer W with the predetermined gaps between the wafer and the table, the processed wafer W can be cooled without directly touching the cooling table 17. Accordingly, contamination of the wafer W due to contact with the cooling table and vibrations attributable to rapid cooling can be prevented, and therefore, no particles can be produced. Thus, the yield can be improved.

Further, the support members 20 have their respective regulating portions 22 for restraining the movement of the peripheral edge of the wafer W, and are arranged at suitable intervals along the peripheral edge of the cooling table 17. Thus, the wafer W can be supported easily and accurately over the cooling table 17 with the predetermined gaps between the wafer W and the table 17.

Since the support portions 21 are arcuate or straight in shape, moreover, the area of contact with the wafer W can be made small, so that the wafer W can be heated uniformly, and the production and adhesion of particles can be reduced or prevented.

It is to be understood that the present invention is not limited to the embodiment described above, and that various changes and modifications may be effected therein by one skilled in the art without departing from the scope or spirit of the invention. For example, the cassette may be disposed in the first transfer chamber, or only one vacuum reserve chamber may be used in place of the two. Further, the wafer may be kept in a vacuum as it is transferred between the first transfer chamber and each vacuum reserve chamber. Moreover, the inert gas, as the ambient gas in which the wafer is transferred at the atmospheric pressure or higher pressure, may be replaced with clean air that is thoroughly cleared of water, for example. Besides nitrogen gas, furthermore, helium gas, argon gas, carbon dioxide gas, etc. may be used as the inert gas.

The vacuum process chambers may be two or four or more in number. The vacuum process chambers may be used for various processes, such as oxidation, doping, annealing, etching, ashing, etc., and the vacuum process apparatus according to the present invention may be applied to a wide variety of processes including those processes.

The support members 20 for supporting the wafer may be formed of a calcined bore-free material based on, for example, titania ($TiO_2$), as well as quartz and ceramics. In the case where the objects of process permit some contamination, as mentioned before, the support members 20 may be formed of aluminum or some other metal. Besides semiconductor wafers, LCD substrates and the like are available as the objects of process.

What is claimed is:

1. A vacuum process apparatus, which is provided with a plurality of vacuum process chambers for subjecting an object of process to predetermined processes, comprising:

a vacuum reserve chamber for delivering the object in a substantially vacuum state to the vacuum process chambers and receiving the processed object substantially at the atmospheric pressure from the vacuum process chambers;

a cooling table for cooling the processed object in the vacuum reserve chamber; and support members arranged so as to support the object over the cooling table with predetermined gaps between the object and the table.

2. The vacuum process apparatus according to claim 1, wherein each said support member includes a projection formed on the cooling table so as to support the object.

3. The vacuum process apparatus according to claim 1, wherein each said support member includes a regulating portion for restraining diametrical movement of the object.

4. The vacuum process apparatus according to claim 1, wherein said support members are formed of quartz.

5. A vacuum process apparatus, which is provided with a plurality of vacuum process chambers for subjecting an object of process to predetermined processes, comprising:

a vacuum reserve chamber for delivering the object in a substantially vacuum state to the vacuum process chambers and receiving the processed object substantially at the atmospheric pressure from the vacuum process chambers;

a cooling table for cooling the processed object in the vacuum reserve chamber; and preheating means arranged over the cooling table so as to preheat the unprocessed object.

6. The vacuum process apparatus according to claim 5, further comprising a first ring-shaped support portion for supporting the unprocessed object in the vacuum reserve chamber and a second ring-shaped support portion for supporting the processed object in the vacuum reserve chamber.

7. The vacuum process apparatus according to claim 6, wherein each of said first and second ring-shaped support portions includes projections arranged so as to support the object with predetermined gaps between the object and the support portion.

\* \* \* \* \*